United States Patent
Agrawal et al.

(10) Patent No.: US 12,366,616 B2
(45) Date of Patent: Jul. 22, 2025

(54) MAGNETIC FIELD SENSOR, METHOD FOR PRODUCING SAME, AND METHOD FOR MEASURING A MAGNETIC FIELD

(71) Applicant: Infineon Technologies AG, Neubiberg (DE)

(72) Inventors: Milan Agrawal, Munich (DE); Juergen Zimmer, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/048,254

(22) Filed: Oct. 20, 2022

(65) Prior Publication Data
US 2023/0126694 A1    Apr. 27, 2023

(30) Foreign Application Priority Data
Oct. 21, 2021 (DE) .......................... 102021127346.3

(51) Int. Cl.
| | | |
|---|---|---|
| *G01R 33/09* | (2006.01) | |
| *G01R 33/00* | (2006.01) | |
| *G01R 33/025* | (2006.01) | |
| *G01R 33/07* | (2006.01) | |

(52) U.S. Cl.
CPC ....... *G01R 33/093* (2013.01); *G01R 33/0005* (2013.01); *G01R 33/025* (2013.01); *G01R 33/075* (2013.01); *G01R 33/098* (2013.01)

(58) Field of Classification Search
CPC ...... G01R 33/025; G01R 33/06; G01R 33/07; G01R 33/072; G01R 33/075; G01R 33/09; G01R 33/091; G01R 33/093; G01R 33/098; G01R 33/0005; H10N 50/10; H10N 50/20; H10N 52/00; H10N 52/80; H10N 52/85
See application file for complete search history.

(56) References Cited

U.S. PATENT DOCUMENTS

| | | | |
|---|---|---|---|
| 2016/0202330 A1* | 7/2016 | Yamamoto | H01F 10/3286 324/252 |
| 2017/0131367 A1* | 5/2017 | Hegedus | G01R 15/20 |
| 2018/0166197 A1* | 6/2018 | Wang | H10N 52/00 |
| 2019/0227130 A1 | 7/2019 | Hong et al. | |
| 2019/0377037 A1* | 12/2019 | Wu | G01R 33/0052 |
| 2020/0106002 A1* | 4/2020 | Song | H01F 41/302 |
| 2020/0200837 A1 | 6/2020 | Zimmer et al. | |
| 2021/0119117 A1* | 4/2021 | Kim | C22C 27/04 |
| 2021/0359199 A1* | 11/2021 | Lin | H10N 50/01 |

FOREIGN PATENT DOCUMENTS

| | | | | |
|---|---|---|---|---|
| CN | 113299821 A | * | 8/2021 | ........... H01L 27/228 |
| WO | 2015/083601 A1 | | 6/2015 | |
| WO | 2018/198901 A1 | | 11/2018 | |
| WO | 2019/093964 A1 | | 5/2019 | |

OTHER PUBLICATIONS

Luo et al., "Magnetic angular position sensor enabled by spin-orbit torque," Applied Physics Letters, vol. 112, Issue 26, 2018, 6 pages.

* cited by examiner

*Primary Examiner* — David M Schindler
(74) *Attorney, Agent, or Firm* — Harrity & Harrity, LLP (57) ABSTRACT

The present disclosure relates to a magnetic field sensor, in particular an angle sensor, including a magnetoresistive sensor component and a spin-orbit torque, SOT, sensor component.

22 Claims, 4 Drawing Sheets

MAGNETIC FIELD SENSOR, METHOD FOR PRODUCING SAME, AND METHOD FOR MEASURING A MAGNETIC FIELD

CROSS REFERENCE TO RELATED APPLICATION

This application claims priority to German Patent Application No. 102021127346.3 filed on Oct. 21, 2021, the content of which is incorporated by reference herein in its entirety.

TECHNICAL FIELD

The present disclosure is concerned with magnetic field sensors and in particular with angle sensors comprising a magnetoresistive (MR) sensor component and a spin-orbit torque (SOT) sensor component.

BACKGROUND

Angle sensors are an essential component for the control of rotational movements in a large number of applications, e.g. in the automotive industry, in consumer goods, in manufacturing, etc. Among the various types of angle sensors, magnetic sensors are the most widely used since they combine non-contact detection, robust performance and low costs. A typical construction for magnetic angle detection comprises a magnet secured to a rotating shaft in order to generate a magnetic flux that varies over time, and a stationary magnetic sensor that detects the flux. Depending on whether the time derivative, a magnitude or a direction of the magnetic flux is detected, the sensor can be classified in three main types: inductive, Hall effect and magnetoresistance sensors (MR).

Each type of sensor has its own advantages and disadvantages. The inductive sensor is robust and very durable, for example. At the same time, however, it is rather bulky and more expensive in comparison with Hall and MR sensors. Hall sensors, which are currently predominant in automotive applications, are cost-effective, but have a moderate sensitivity for a low field and a relatively large thermal drift. The MR sensors, including the anisotropic magnetoresistance sensor (AMR), the giant magnetoresistance sensor (GMR) and the tunnel magnetoresistance sensor (TMR), bridge the gap between Hall and inductive sensors with regard to field sensitivity, recognition accuracy and costs.

MR sensors have been developed as read sensors for data storage applications. If they are configured correctly, however, these sensors in the saturation state can generate a sinusoidal output signal with respect to an external field direction; therefore, they function as angle sensors as well. Although the functional principle is simple, special designs and production methods are required to obtain sinusoidal output signals free of distortion; therefore, they tend to be more expensive than Hall sensors.

MR sensors also have some deficiencies. In this regard, although AMR-based angle sensors have a negligible lifetime drift, they have only a 180 degree periodicity in the angle measurement. On the other hand, GMR- or TMR-angle sensors have a full 360 degree periodicity, but have a lifetime drift on account of their complex multilayered sensor element stack. In the case of MR sensor technology, the lifetime drift arises as a result of the change in the magnetization direction of the reference system. This change in the magnetization leads to a phase drift of the sensor output signal and ultimately to an additional angle error.

Therefore, there is a need for angle sensors with recognition and/or compensation of lifetime drift.

SUMMARY

This need is met by devices and methods as claimed in the independent patent claim. The dependent claims relate to advantageous developments.

In accordance with a first aspect of the present disclosure, a magnetic field sensor, in particular an angle sensor, including an MR sensor component and a spin-orbit torque (SOT) sensor component, is proposed. A combination of SOT technology with MR technology for the recognition and/or compensation of lifetime drift of the MR sensor component is thus proposed.

SOT technology can have sensor layers in a manner as simple as an AMR sensor, but has a full 360 degree periodicity. The combination of SOT technology with MR technology affords a solution in which the inadequacies (lifetime phase drift) of MR technology can be rectified by a redundant and diverse solution. An SOT sensor has the same sinusoidal angle dependence as TMR- and GMR sensors, but is constructed structurally more simply and can therefore potentially result in an angle sensor which is more cost-effective in comparison with its GMR- and TMR-counterparts. The SOT effect in a heterostructure composed of heavy metal (HM)/ferromagnet (FM) has been investigated extensively in recent years as a promising mechanism for magnetization switching and applications associated therewith. Although the exact mechanism is still disputed, it is generally assumed that HM/FM-heterostructures contain two types of torques, one of which is referred to as field-like (FL) and the other as (anti)damping-like (DL).

In accordance with some example implementations, the MR sensor component and the SOT sensor component of the magnetic field sensor are configured to measure an external magnetic field redundantly. Both sensor components thus measure one and the same (rotating) magnetic field.

For this purpose, in accordance with some example implementations, the MR sensor component and the SOT sensor component can be monolithically integrated on a common substrate (e.g. semiconductor substrate). That is to say that the sensor components can be configured as a common integrated circuit and can thus be positioned spatially close to one another.

In accordance with some example implementations, the MR sensor component and the SOT sensor component can be integrated in a common layer stack composed of magnetic and nonmagnetic layers. The layer stack can be formed on the common (semiconductor) substrate.

In order to obtain measurement results that are as independent of one another as possible, the MR sensor component and the SOT sensor component can be galvanically isolated from one another. For this purpose, the MR sensor component and the SOT sensor component can be separated from one another by a magnesium oxide layer (MgO), for example.

In accordance with some example implementations, the MR sensor component can be formed within a layer stack in layers above the SOT sensor component. Alternatively, the SOT sensor component can be formed within a layer stack in layers above the MR sensor component. In both variants, the sensor components are thus stacked one above another.

In accordance with some example implementations, the MR sensor component can have a current-perpendicular-to-plane (CPP) configuration, such that a current perpendicular to the free layer (and other layers) flows through the layer stack of the MR sensor component. In contrast to the MR sensor component, the SOT sensor component, in accordance with some example implementations, can have a current-in-plane (CIP) configuration, wherein a current flows laterally through the layer stack of the SOT sensor component.

In accordance with some example implementations, the MR sensor component and the SOT sensor component can be arranged in a common chip package. In this case, both sensor components can be arranged on a common semiconductor die or on separate semiconductor dies.

In accordance with some example implementations, the MR sensor component has at least one Wheatstone bridge circuit. In this case, four MR resistance elements can be arranged in the Wheatstone bridge circuit. A respective Wheatstone bridge circuit can be provided for the measurement of sine and cosine magnetic field components, the respective reference magnetizations differing by 90°.

In accordance with some example implementations, the SOT sensor component has at least one Hall cross arrangement. With a pair of Hall crosses composed of heavy metal/ferromagnet heterostructures, it is possible to realize a 360° detection over the entire range. Current axes of the two Hall crosses can be oriented orthogonally to one another, such that on account of current pulses of opposite polarity, a differential Hall voltage has a sine and/or cosine angle dependence on the field direction if both SOT sensor components are exposed to a magnetic field rotating in the plane. The angle of rotation of the field can then be calculated from the sine and cosine output signals by way of the arctan 2 function.

In accordance with some example implementations, the MR sensor component and the SOT sensor component are configured in each case as angle sensors in order to measure in each case a sin and cos component of an angle of rotation of a rotating external magnetic field. This then necessitates in each case an MR sin and cos sensor component and an SOT sin and cos sensor component.

In accordance with some example implementations, the SOT sensor component is configured to determine measurement drifts of the MR sensor component. This is possible because the SOT sensor component has less lifetime drift than the MR sensor component.

In accordance with some example implementations, the MR sensor component has a GMR- and/or a TMR sensor component. The SOT sensor component can thus be combined with a GMR sensor component or a TMR sensor component.

A further aspect of the present disclosure relates to a method for measuring a (rotating) magnetic field, including measuring the magnetic field using an MR sensor component and measuring the magnetic field using an SOT sensor component.

In accordance with some example implementations, the measuring involves measuring in each case a sin and cos component of an angle of rotation of the magnetic field. That is to say that the MR sensor component can measure a sin and cos component of the angle of rotation and the SOT sensor component can measure a sin and cos component of the angle of rotation.

In accordance with some example implementations, a measurement shift (drift) over a lifetime of the MR sensor component can be corrected using a measurement of the SOT sensor component.

Yet another aspect of the present disclosure relates to a method for producing a magnetic field or angle sensor, including forming an MR sensor component on a substrate and forming an SOT sensor component on the substrate.

In accordance with some example implementations, the MR sensor component and the SOT sensor component can be monolithically integrated on the substrate.

In accordance with some example implementations, the MR sensor component and the SOT sensor component can be formed in a common layer stack composed of magnetic and nonmagnetic layers.

In accordance with some example implementations, the MR sensor component and the SOT sensor component can be galvanically isolated from one another by an MgO layer.

In accordance with some example implementations, the MR sensor component can be formed within a layer stack in layers above the SOT sensor component.

In accordance with some example implementations, the MR sensor component can include a GMR- and/or TMR layer stack.

BRIEF DESCRIPTION OF THE DRAWINGS

Some examples of devices and/or methods are explained in greater detail merely by way of example below with reference to the accompanying figures, in which.

DETAILED DESCRIPTION

Some examples will now be described more thoroughly with reference to the accompanying figures. However, further possible examples are not restricted to the features of these implementations described in detail. These may have modifications of the features and counterparts and alternatives to the features. Furthermore, the terminology used herein for describing specific examples is not intended to be limiting for further possible examples.

Throughout the description of the figures, identical or similar reference signs refer to identical or similar elements or features which can be implemented in each case identically or else in modified form, while they provide the same or a similar function. In the figures, furthermore, the thicknesses of lines, layers and/or regions may be exaggerated for elucidation purposes.

If two elements A and B are combined using an "or", this should be understood such that all possible combinations are disclosed, e.g. only A, only B, and A and B, unless expressly defined otherwise in an individual case. As alternative wording for the same combinations, it is possible to use "at least from A and B" or "A and/or B". That applies equivalently to combinations of more than two elements.

If a singular form, e.g. "a, an" and "the" is used and the use of only a single element is defined neither explicitly nor implicitly as obligatory, further examples can also use a plurality of elements in order to implement the same function. If a function is described below as being implemented using a plurality of elements, further examples can implement the same function using a single element or a single processing entity. Furthermore, it goes without saying that the terms "comprises", "comprising", "has" and/or "having" in their usage describe the presence of the specified features, integers, steps, operations, processes, elements, components and/or a group thereof, but do not exclude the presence or the addition of one or more other features, integers, steps, operations, processes, elements, components and/or a group thereof.

Figure 1:
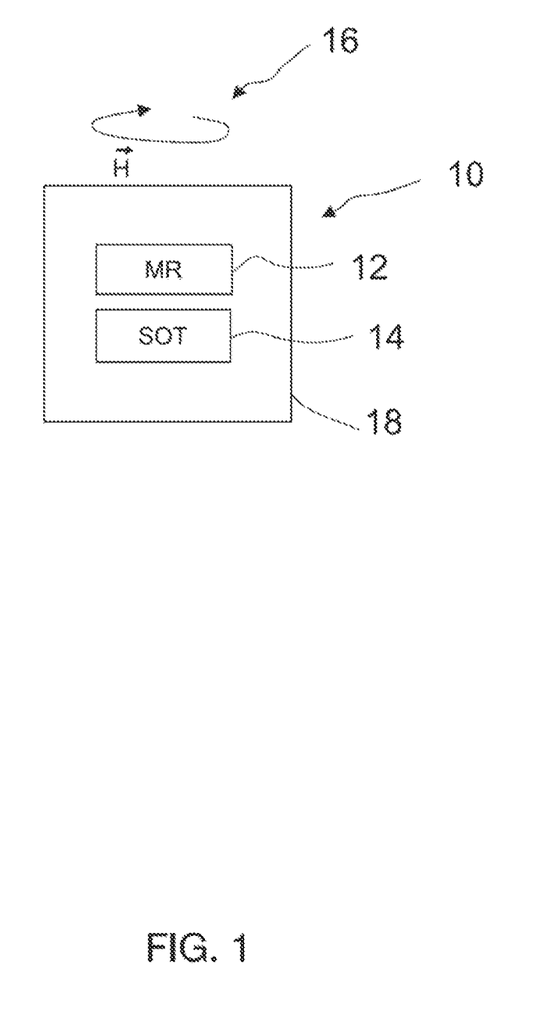
FIG. 1 shows a magnetic angle sensor in accordance with the present disclosure.

FIG. 1 shows a magnetic angle sensor 10 in accordance with one example implementation of the present disclosure. The magnetic angle sensor 10 comprises an MR sensor component 12 and an SOT sensor component 14. Both the MR sensor component 12 and the SOT sensor component 14 can each be configured to measure an angle of a rotating external magnetic field 16 and to output corresponding angle signals. In this case, both sensor components 12, 14 are configured to measure the same external rotating magnetic field 16.

The magnetic angle sensor 10 can be a dual-die angle sensor, in which MR sensor component 12 and SOT sensor component 14 are provided on different semiconductor dies in a common chip package 18. In some implementations, the magnetic angle sensor 10 is a single-die angle sensor, in which MR sensor component 12 and SOT sensor component 14 are provided on a single semiconductor die, e.g. are also fabricated monolithically on a common semiconductor substrate jointly in a common semiconductor fabrication process. In accordance with both concepts, the MR sensor component 12 and the SOT sensor component 14 can be provided in a common chip package 18 and can thus form a redundantly constructed magnet angle sensor 10 having two angle sensor components for measuring the rotating magnetic field 16.

In principle, AMR, GMR, or TMR sensor components are suitable as the MR sensor component 12. In some implementations, the MR sensor component 12 is configured as a GMR or TMR sensor component, since an inherent lifetime drift of the GMR or TMR sensor component 12 can then be compensated for by the SOT sensor component 14, which is more stable in this regard.

GMR or TMR sensor components may be formed on a layer stack composed of magnetic and nonmagnetic layers on a (semiconductor) substrate. In this case, one part of the layer stack is formed by a so-called reference system having a fixed reference magnetization, and another part by a free layer, the magnetization of which changes with the external magnetic field 16 depending on the angle of rotation thereof. An electrical resistance of the MR sensor component changes depending on the direction or the angle of the magnetization of the free layer with respect to the reference magnetization.

In the case of the single-die concept, the SOT sensor component 14 can additionally be integrated in the MR layer stack by the SOT sensor component 14 being formed in layers above or below the layer stack of the MR sensor component 12. However, it is also conceivable to form the SOT sensor component 14 laterally or horizontally next to the MR sensor component 12 on the common (semiconductor) substrate.

Figure 2:
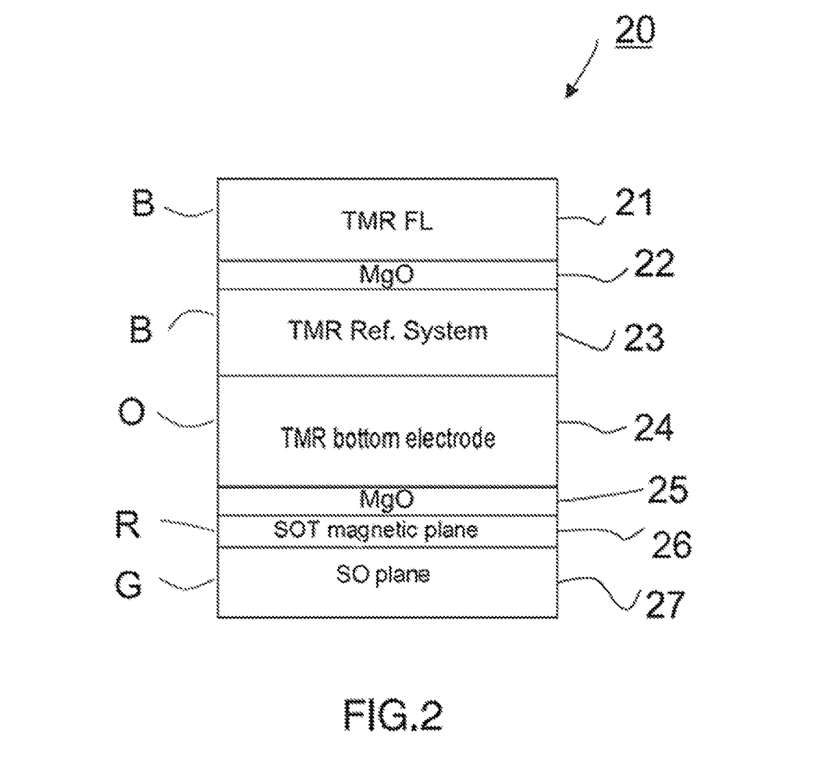
FIG. 2 shows a layer stack comprising an MR sensor component and a SOT sensor component.

FIG. 2 shows an example layer stack 20 in which the MR sensor component 12 and the SOT sensor component 14 are formed jointly. In the example shown, the MR sensor component 12 is a TMR sensor component. However, a similar integration concept also applies to a GMR sensor component.

The TMR layer stack comprises at the top a magnetic layer 21, the free layer (FL), an underlying spacer layer 22 (e.g. MgO) and a reference system 23 lying in turn under the spacer layer 22. Typical materials for the FL layer 21 and the reference system 23 are Ni, Co, Fe and their alloys such as NiFe, CoFe or CoFeB. An electrode 24 (e.g. a Cu layer) of the TMR sensor component 12, the electrode being situated under the reference system 23, can be used to connect two TMR resistance elements of a (Wheatstone) bridge circuit from below. A top electrode of a TMR resistance element can be brought into contact for example with the respective FL layer 21 (see FIG. 3). This results in a so-called CPP configuration for the TMR resistance elements of the MR sensor component 12.

Figure 3:
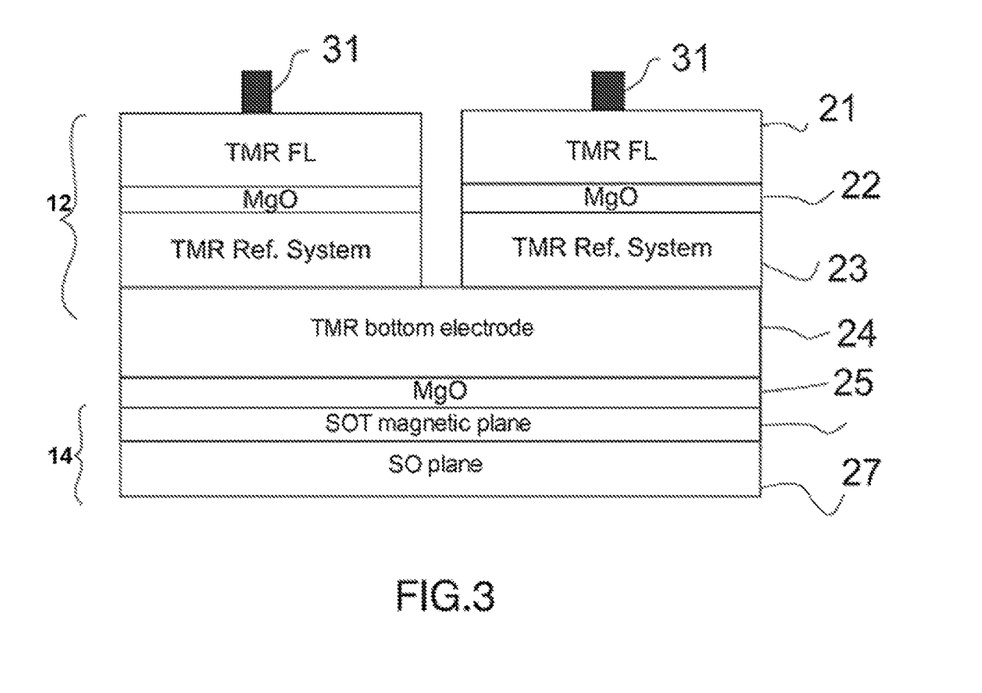
FIG. 3 shows a layer stack comprising an SOT sensor component and two series-connected MR sensor components.
Figure 4:
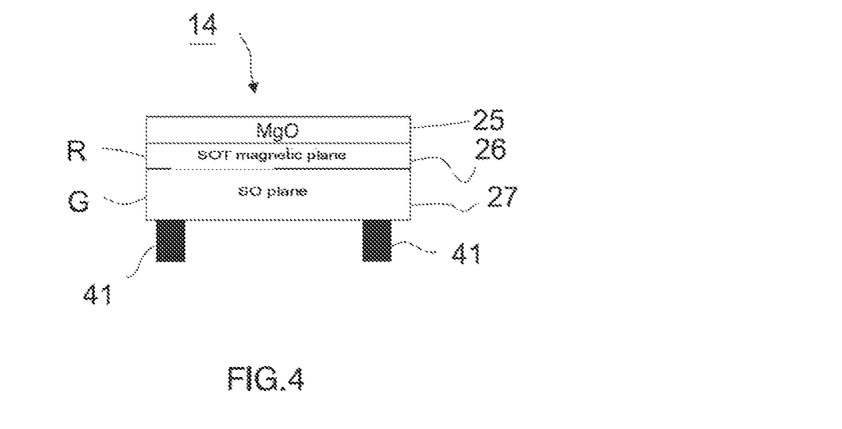
FIG. 4 shows a contacting concept for an SOT sensor component.

The SOT sensor component 14 can be contacted from below for example with the aid of through contacts (through a substrate). The SOT sensor component 14 can comprise two layers 26, 27 below the TMR layer stack or the electrode 24, a (ferro) magnetic layer 26 (Ni, Co, Fe, NiFe, CoFe or CoFeB) and an SO layer 27 underneath. The magnetic layer 26 has the same function as the FL layer 21 of the MR sensor component 12. The SO layer 27 can comprise heavy metals, such as e.g. Pt, W, Ta, etc. Although the entire layer stack 20 can be deposited in a single step, the two sensors 12, 14 remain galvanically isolated by a thick lower magnesium oxide layer (MgO) 25 between the layers 24 and 26. FIGS. 3 and 4 show top via contacts 31 of the MR sensor component 12 and bottom via contacts 41 of the SOT sensor component 14. By virtue of the top electrodes 31 and the bottom electrode 24, a CPP configuration results for the MR sensor component 12. By virtue of the bottom electrodes 41, a CIP configuration results for the SOT sensor component 14.

The functional principle of an MR angle sensor will be described briefly. The MR sensor component 12 can comprise two Wheatstone bridges, namely a sine bridge and cosine bridge. All eight MR measuring resistors of these two bridges (four per bridge) are embodied physically identically and, in some implementations, in a circular fashion in order to reduce the shape anisotropy. However, a magnetization direction of the reference systems 23 in the resistors of the sine bridge is rotated by 90° (orthogonally) with respect to the cosine bridge. Respective voltage output signals of these bridges can be written as follows:

$$V_{sin} = V_{01} \sin\theta \qquad (1)$$

$$V_{cos} = V_{02} \cos\theta \qquad (2)$$

$$\theta_{sens} = \tan^{-1}\left(\frac{V_{sin}}{V_{cos}}\right) \qquad (3)$$

In this case, $\theta$ denotes an angle between the magnetization of the free layer 21 and the reference layer 23. By measuring the voltage signals $V_{sin}$ and $V_{cos}$, it is possible to calculate the angle $\theta$ of the applied magnetic field 16 in accordance with equation (3).

Figure 5:
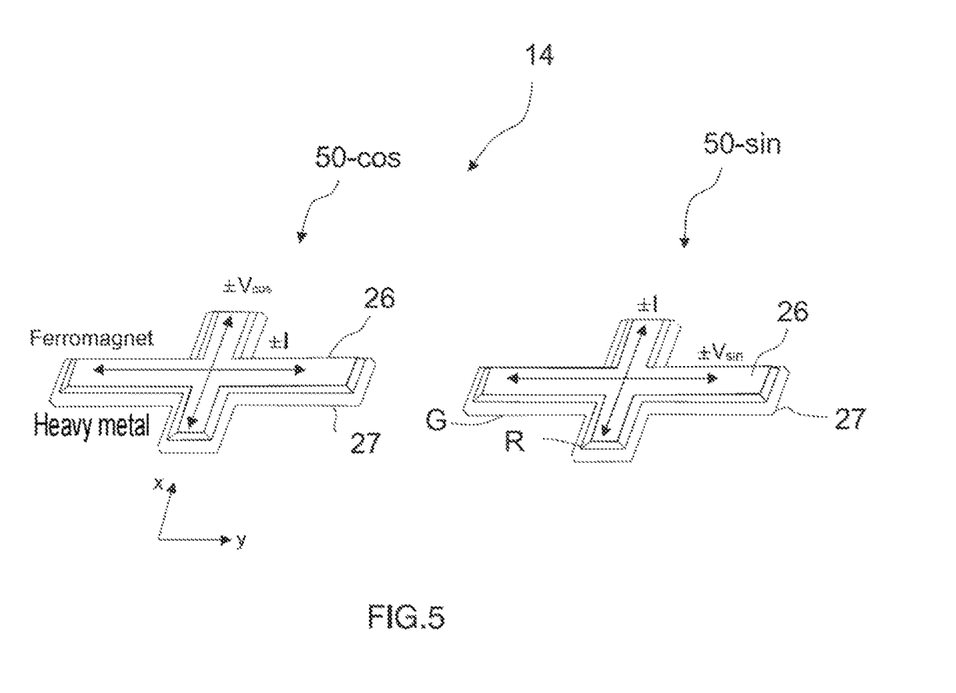
FIG. 5 shows an SOT cosine Hall cross and an SOT sine Hall cross.

The functional principle of an SOT angle sensor will be described briefly. As is shown in FIG. 5, the SOT sensor component 14 can comprise two identically configured rectangular Hall crosses 50-sin, 50-cos, one of which functions as a sine signal transmitter and the other as a cosine signal transmitter. The functioning of such an SOT angle sensor is described in detail for example in Luo et al., "*Magnetic angular position sensor enabled by spin-orbit torque*", Appl. Phys. Lett. 112, 262405 (2018). The spin-orbit torque (SOT) is induced by the spin-orbit interaction or the Rashba effect at the interface of dissimilar materials, that is to say the interface between the layers 26, 27. The Hall crosses 50-sin, 50-cos are fabricated from a ferromagnet/heavy metal heterostructure 26, 27 and are arranged together with the MR resistance elements of the MR angle sensor 12 in the layer stack 20 on a common (semiconductor) substrate. In contrast to the MR sensor component 12, the SOT sensor component 14 comprising the Hall crosses 50-sin, 50-cos has only one (ferro) magnetic layer 26, which is analogous to the free layer 21 of the MR sensor component 12. The orthogonal current flow directions x, y in the two Hall crosses 50-sin, 50-cos make them sensitive to the orthogonal components x, y of the external magnetic field 16 in the x-y-plane. The current flow generates a sinusoidal signal having a periodicity of 180° on account of the planar Hall effect (PHE) and the anomalous Hall effect (AHE). A differential sine or cosine signal (periodicity 360°) is generated by virtue of current flowing in opposite directions. The signals thus obtained can be used for evaluating the angle θ of the magnetic field 16 in the x-y-plane using the same equations (equ. 1-3).

The SOT sensor component 14 has an angle periodicity of 360° and has substantially no lifetime drift of its performance. However, an output signal requires complex post-processing in order to obtain the angle information. Therefore, a standalone SOT sensor is associated with a certain complexity. A combination of SOT technology with TMR/GMR technology means significant progress, however. In the case of the combined SOT and TMR/GMR sensor 10, the TMR/GMR sensor 12 functions as the main sensor, while the SOT sensor 14 is used for evaluating the phase shifts during the lifetime. Compensation of the drifts makes it possible to maintain the performance of the TMR/GMR sensor 12 over the entire lifetime. The integrated sensor 10 will therefore have similar capabilities to conventional GMR/TMR sensors, but with a significantly better performance during its lifetime.

Figure 6:
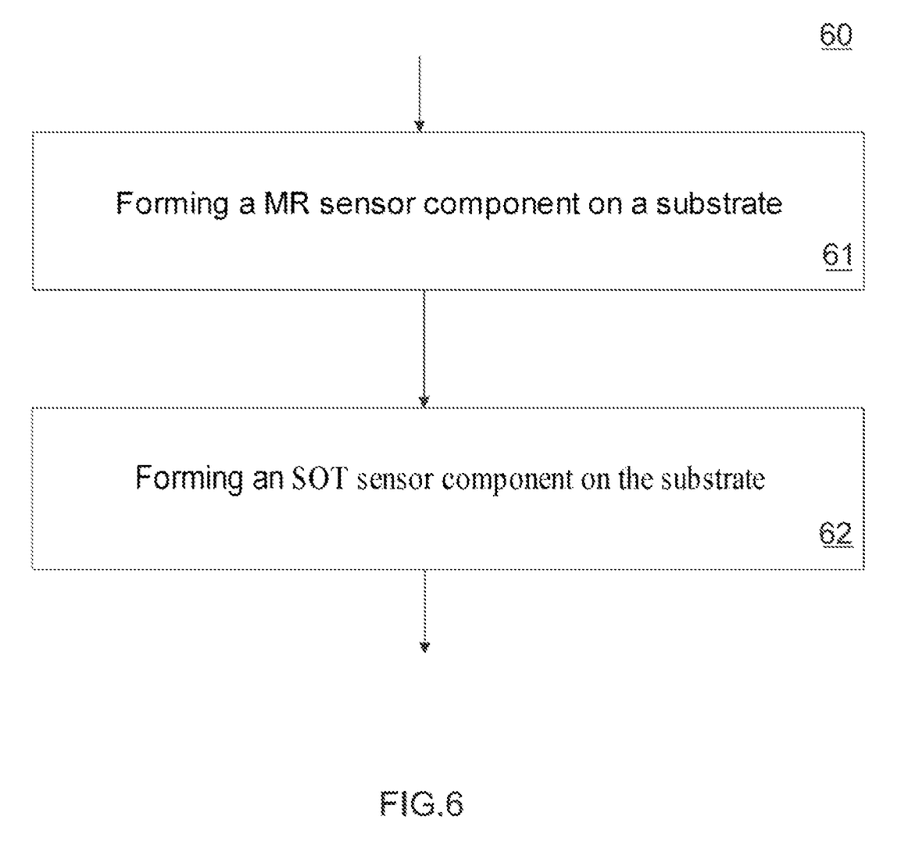
FIG. 6 shows a method for producing an angle sensor in accordance with the present disclosure.

In summary, example implementations of the present disclosure concern monolithic integration of SOT sensors with GMR or TMR sensors in a single-stack coating process. The production of the combined sensor 10 does not require a new integration concept and is therefore cost-effective in comparison with the dual-die sensor concept. FIG. 6 shows a schematic flow diagram of a corresponding production method 60.

The method 60 for producing the magnetic field sensor 10 comprises forming 61 an MR sensor component 12 on a substrate and forming 62 an SOT sensor component 14 on the substrate. In this case, the MR sensor component 12 and the SOT sensor component 14 can be monolithically integrated on the substrate, for example in the form of the layer stack 20.

Although the detailed description has been given in regard to angle sensors, it will be apparent to the person skilled in the art that the proposed concept is also applicable to other applications of magnetic field sensors in which a redundant magnetic field measurement is advantageous.

The aspects and features that have been described in association with a specific one of the examples above can also be combined with one or more of the further examples in order to replace an identical or similar feature of this example or in order additionally to introduce the feature into the further example.

It furthermore goes without saying that the disclosure of a plurality of steps, processes, operations or functions disclosed in the description or the claims should not be interpreted as being mandatorily in the order described, unless this is explicitly indicated or absolutely necessary for technical reasons in an individual case. Therefore, the preceding description does not limit the implementation of a plurality of steps or functions to a specific order. Furthermore, in further examples, an individual step, an individual function, an individual process or an individual operation can include a plurality of partial steps, partial functions, partial processes or partial operations and/or be subdivided into them.

Where some aspects in the preceding sections have been described in association with the device or a system, these aspects should also be understood as a description of the corresponding method. In this case, for example, a block, a device or a functional aspect of a device or of the system can correspond to a feature, for instance a method step, of the corresponding method. Analogously thereto, aspects described in association with a method should also be understood as a description of a corresponding block, a corresponding element, a property or a functional feature of a corresponding device or a corresponding system.

The claims that follow are hereby incorporated in the detailed description, where each claim can be representative of a separate example by itself. Furthermore, it should be taken into consideration that—although a dependent claim refers in the claims to a specific combination with one or more other claims—other examples can also encompass a combination of the dependent claim with the subject of any other dependent or independent claim. Such combinations are hereby explicitly proposed, provided that in an individual case no indication is given that a specific combination is not intended. Furthermore, features of a claim are also intended to be included for any other independent claim, even if this claim is not directly defined as being dependent on this other independent claim.

What is claimed is:

1. A magnetic field sensor, comprising:
 a magnetoresistive sensor component;
 a spin-orbit torque (SOT) sensor component; and
 an oxide layer arranged between the magnetoresistive sensor component and the SOT sensor component,
 wherein the magnetoresistive sensor component and the SOT sensor component are monolithically integrated on a common substrate,
 wherein the SOT sensor component is formed with a ferromagnet/heavy metal heterostructure that includes:
  a magnetic layer configured as a first sensor layer; and
  a heavy metal layer,
 wherein the magnetoresistive sensor component includes:
  a bottom electrode arranged on the oxide layer;
  a first magnetoresistive element formed by a first layer stack, including the bottom electrode, a first reference system arranged on the bottom electrode, a first spacer layer arranged on the first reference system, a first free layer arranged on the first spacer layer and configured as a second sensor layer, and a first top electrode arranged on the first free layer, wherein the first spacer layer is arranged between the first reference system and the first free layer; and a second magnetoresistive element formed by a second layer stack, including the bottom electrode, a second reference system arranged on the bottom electrode, a second spacer layer arranged on the second reference system, a second free layer arranged on the second spacer layer and configured as a third sensor layer, and a second top electrode arranged on the second free layer, wherein the second spacer layer is arranged between the second reference system and the second free layer, wherein the oxide layer is configured to galvanically isolate the first magnetoresistive element and the second magnetoresistive element from the SOT sensor component, and wherein the bottom electrode is common to the first magnetoresistive element and the second magnetoresistive element such that the first magnetoresistive element and the second magnetoresistive element are electrically connected by the bottom electrode to form a bridge circuit configured for measuring a rotating external magnetic field.

2. The magnetic field sensor as claimed in claim 1, wherein the magnetoresistive sensor component and the SOT sensor component are configured to redundantly measure a same angle of the rotating external magnetic field over a full 360 degree periodicity.

3. The magnetic field sensor as claimed in claim 2, wherein the SOT sensor component has a same sinusoidal angle dependence as the magnetoresistive sensor component.

4. The magnetic field sensor as claimed in claim 1, wherein the magnetoresistive sensor component and the SOT sensor component are arranged in a common chip package.

5. The magnetic field sensor as claimed in claim 1, wherein the SOT sensor component has at least one Hall cross arrangement.

6. The magnetic field sensor as claimed in claim 1, wherein the magnetoresistive sensor component is configured as a first angle sensor and the SOT sensor component is configured as a second angle sensor, wherein the magnetoresistive sensor component and the SOT sensor component are each configured to measure a sine component of an angle of rotation of the rotating external magnetic field and a cosine component of the angle of rotation of the rotating external magnetic field.

7. The magnetic field sensor as claimed in claim 1, wherein the magnetoresistive sensor component is configured as a first angle sensor and the SOT sensor component is configured as a second angle sensor, wherein the magnetoresistive sensor component is configured to generate a first sensor signal corresponding to a sine component of an angle of rotation of the rotating external magnetic field, and generate a second sensor signal corresponding to a cosine component of the angle of rotation of the rotating external magnetic field, and wherein the SOT sensor component is configured to generate a third sensor signal corresponding to the sine component of the angle of rotation of the rotating external magnetic field, and generate a fourth sensor signal corresponding to the cosine component of the angle of rotation of the rotating external magnetic field.

8. The magnetic field sensor as claimed in claim 7, wherein the magnetoresistive sensor component includes a first sensor bridge configured to generate the first sensor signal, and a second sensor bridge configured to generate the second sensor signal, and wherein the bridge circuit is included in one of the first sensor bridge or the second sensor bridge, and wherein the SOT sensor component includes a first Hall cross arrangement having a first current axis, and a second Hall cross arrangement having a second current axis that is oriented orthogonal relative to the first current axis, wherein the first Hall cross arrangement is configured to generate the third sensor signal, and wherein the second Hall cross arrangement is configured to generate the fourth sensor signal.

9. The magnetic field sensor as claimed in claim 1, wherein the oxide layer is formed on the SOT sensor component such that the oxide layer is arranged between the bottom electrode and the SOT sensor component, and wherein the magnetic layer of the SOT sensor component is in direct contact with the oxide layer.

10. The magnetic field sensor as claimed in claim 1, wherein the first magnetoresistive element and the second magnetoresistive element are giant magnetoresistance (GMR) resistance elements or the first magnetoresistive element and the second magnetoresistive element are tunnel magnetoresistance (TMR) resistance elements.

11. The magnetic field sensor as claimed in claim 1, wherein the magnetoresistive sensor component, using the bridge circuit, is configured to generate a first sensor signal corresponding to a first sinusoidal component of an angle of rotation of the rotating external magnetic field, and wherein the SOT sensor component is configured to generate a second sensor signal corresponding to the first sinusoidal component of the angle of rotation of the rotating external magnetic field.

12. The magnetic field sensor as claimed in claim 11, wherein the SOT sensor component is configured to generate a third sensor signal corresponding to a second sinusoidal component of the angle of rotation of the rotating external magnetic field.

13. The magnetic field sensor as claimed in claim 12, wherein the SOT sensor component includes a first Hall cross arrangement having a first current axis, and wherein the first Hall cross arrangement is configured to generate the second sensor signal.

14. The magnetic field sensor as claimed in claim 13, wherein the SOT sensor component includes a second Hall cross arrangement having a second current axis that is oriented orthogonal relative to the first current axis, and wherein the second Hall cross arrangement is configured to generate the third sensor signal.

15. The magnetic field sensor as claimed in claim 1, wherein the magnetic field sensor comprises a first angle sensor, comprising the magnetoresistive sensor component, and a second angle sensor, comprising the SOT sensor component, wherein the first angle sensor, using the magnetoresistive sensor component, is configured to measure an angle of rotation of the rotating external magnetic field, and wherein the second angle sensor, using the SOT sensor component, is configured to measure the angle of rotation of the rotating external magnetic field.

16. A method for measuring a rotating external magnetic field, comprising measuring the rotating external magnetic field using a magnetoresistive sensor component; and measuring the rotating external magnetic field using a spin-orbit torque (SOT) sensor component,
wherein the SOT sensor component is formed with a ferromagnet/heavy metal heterostructure that includes:
a magnetic layer configured as a first sensor layer; and
a heavy metal layer,
wherein the magnetoresistive sensor component includes:
a bottom electrode arranged on an oxide layer;
a first magnetoresistive element formed by a first layer stack, including the bottom electrode, a first reference system arranged on the bottom electrode, a first spacer layer arranged on the first reference system, a first free layer arranged on the first spacer layer and configured as a second sensor layer, and a first top electrode arranged on the first free layer, wherein the first spacer layer is arranged between the first reference system and the first free layer; and
a second magnetoresistive element formed by a second layer stack, including the bottom electrode, a second reference system arranged on the bottom electrode, a second spacer layer arranged on the second reference system, a second free layer arranged on the second spacer layer and configured as a third sensor layer, and a second top electrode arranged on the second free layer, wherein the second spacer layer is arranged between the second reference system and the second free layer,
wherein the first magnetoresistive element and the second magnetoresistive element are galvanically isolated from the SOT sensor component by the oxide layer arranged between the SOT sensor component and the magnetoresistive sensor component, and
wherein the bottom electrode is common to the first magnetoresistive element and the second magnetoresistive element such that the first magnetoresistive element and the second magnetoresistive element are electrically connected by the bottom electrode to form a bridge circuit configured for measuring the rotating external magnetic field.

17. The method as claimed in claim 16, wherein the magnetoresistive sensor component includes a first Wheatstone bridge and a second Wheatstone bridge,
wherein measuring the rotating external magnetic field using the magnetoresistive sensor component includes measuring, using the first Wheatstone bridge of the magnetoresistive sensor component, a sine component of an angle of rotation of the rotating external magnetic field, and measuring, using the second Wheatstone bridge of the magnetoresistive sensor component, a cosine component of the angle of rotation of the rotating external magnetic field, wherein the bridge circuit is part of one of the first Wheatstone bridge or the second Wheatstone bridge, and
wherein measuring the rotating external magnetic field using the SOT sensor component includes measuring, using a first Hall cross arrangement, the sine component of the angle of rotation of the rotating external magnetic field, and measuring, using a second Hall cross arrangement, the cosine component of the angle of rotation of the rotating external magnetic field.

18. The method as claimed in claim 16, wherein the first magnetoresistive element and the second magnetoresistive element are giant magnetoresistance (GMR) resistance elements or the first magnetoresistive element and the second magnetoresistive element are tunnel magnetoresistance (TMR) resistance elements.

19. A method for producing a magnetic field sensor comprising
forming a magnetoresistive sensor component on a substrate;
forming a spin-orbit torque (SOT) sensor component on the substrate; and
forming an oxide layer on the substrate such that the oxide layer is arranged between the magnetoresistive sensor component and the SOT sensor component,
wherein the SOT sensor component is formed from a ferromagnet/heavy metal heterostructure that includes:
a magnetic layer configured as a first sensor layer; and
a heavy metal layer,
wherein the magnetoresistive sensor component includes:
a bottom electrode arranged on the oxide layer;
a first magnetoresistive element formed by a first layer stack, including the bottom electrode, a first reference system arranged on the bottom electrode, a first spacer layer arranged on the first reference system, a first free layer arranged on the first spacer layer and configured as a second sensor layer, and a first top electrode arranged on the first free layer, wherein the first spacer layer is arranged between the first reference system and the first free layer; and
a second magnetoresistive element formed by a second layer stack, including the bottom electrode, a second reference system arranged on the bottom electrode, a second spacer layer arranged on the second reference system, a second free layer arranged on the second spacer layer and configured as a third sensor layer, and a second top electrode arranged on the second free layer, wherein the second spacer layer is arranged between the second reference system and the second free layer,
wherein the first magnetoresistive element and the second magnetoresistive element are galvanically isolated from the SOT sensor component by the oxide layer, and
wherein the bottom electrode is common to the first magnetoresistive element and the second magnetoresistive element such that the first magnetoresistive element and the second magnetoresistive element are electrically connected by the bottom electrode to form a bridge circuit configured for measuring a rotating external magnetic field.

20. The method as claimed in claim 19, wherein the oxide layer is an MgO layer.

21. The method as claimed in claim 19, wherein the first magnetoresistive element and the second magnetoresistive element are giant magnetoresistance (GMR) resistance elements or the first magnetoresistive element and the second magnetoresistive element are tunnel magnetoresistance (TMR) resistance elements.

22. A magnetic field sensor, comprising:
a magnetoresistive sensor component;
a spin-orbit torque (SOT) sensor component; and
an oxide layer arranged between the magnetoresistive sensor component and the SOT sensor component,
wherein the SOT sensor component is formed with a ferromagnet/heavy metal heterostructure that includes:
a magnetic layer configured as a first sensor layer; and
a heavy metal layer,
wherein the magnetoresistive sensor component includes:
a bottom electrode arranged on the oxide layer;
a first magnetoresistive element formed by a first layer stack, including the bottom electrode, a first reference system arranged on the bottom electrode, a first spacer layer arranged on the first reference system, a first free layer arranged on the first spacer layer and configured as a second sensor layer, and a first top electrode arranged on the first free layer, wherein the first spacer layer is arranged between the first reference system and the first free layer; and a second magnetoresistive element formed by a second layer stack, including the bottom electrode, a second reference system arranged on the bottom electrode, a second spacer layer arranged on the second reference system, a second free layer arranged on the second spacer layer and configured as a third sensor layer, and a second top electrode arranged on the second free layer, wherein the second spacer layer is arranged between the second reference system and the second free layer, wherein the oxide layer is configured to galvanically isolate the first magnetoresistive element and the second magnetoresistive element from the SOT sensor component, and wherein the magnetoresistive sensor component includes a first sensor bridge configured to generate a first sensor signal, and a second sensor bridge configured to generate a second sensor signal, wherein the SOT sensor component includes a first Hall cross arrangement having a first current axis, and a second Hall cross arrangement having a second current axis that is oriented orthogonal relative to the first current axis, wherein the first Hall cross arrangement is configured to generate a third sensor signal, wherein the second Hall cross arrangement is configured to generate a fourth sensor signal, and wherein the bottom electrode is common to the first magnetoresistive element and the second magnetoresistive element such that the first magnetoresistive element and the second magnetoresistive element are electrically connected by the bottom electrode to form a bridge circuit of the first sensor bridge configured for measuring a rotating external magnetic field.

* * * * *